United States Patent [19]

Kusakabe

[11] Patent Number: 5,574,395

[45] Date of Patent: Nov. 12, 1996

[54] SEMICONDUCTOR CIRCUIT

[75] Inventor: Mitsuo Kusakabe, Itami, Japan

[73] Assignee: Mitsubishi Denki Kabushiki Kaisha, Tokyo, Japan

[21] Appl. No.: 449,150

[22] Filed: May 24, 1995

[30] Foreign Application Priority Data

Jun. 17, 1994 [JP] Japan ................................. 6-135700

[51] Int. Cl.$^6$ .............................. H03K 5/08; H01L 25/00; H02H 3/20

[52] U.S. Cl. ........................ 327/309; 327/314; 327/566; 361/91

[58] Field of Search .................................. 327/309, 314, 327/381, 391, 535, 537, 538, 541, 566; 361/91; 257/358, 692

[56] References Cited

U.S. PATENT DOCUMENTS

| | | | |
|---|---|---|---|
| 4,617,482 | 10/1986 | Matsuda | 327/391 |
| 4,760,433 | 7/1988 | Young et al. | 327/566 |
| 4,868,705 | 9/1989 | Shiochi et al. | 361/91 |
| 4,876,584 | 10/1989 | Taylor | 257/358 |
| 5,138,413 | 8/1992 | Grosset et al. | 361/91 |
| 5,319,243 | 6/1994 | Leicht et al. | 257/692 |

OTHER PUBLICATIONS

Schutz von μC–Eingängen in (SAX, H., Dipl.–Ing) in Elektornik Informationen No. May 1990, pp. 230–231.

IBM Technical Disclosure Bulletin, vol. 33, No. 9, Feb. 1991, pp. 5–6.

Primary Examiner—David C. Nelms
Assistant Examiner—Trong Phan
Attorney, Agent, or Firm—Lowe, Price, LeBlanc & Becker

[57] ABSTRACT

A semiconductor circuit which has such a configuration that a power supply terminal connected to an overvoltage protection circuit is formed independently from a power supply terminal connected to a semiconductor circuit unit, or that an overvoltage protection circuit and a semiconductor circuit unit are connected to a common power supply terminal with wirings branched from the power supply terminal with an overcurrent flowing through the overvoltage protection circuit prevented from flowing into the semiconductor circuit unit.

5 Claims, 6 Drawing Sheets

SEMICONDUCTOR CIRCUIT

CROSS-REFERENCE TO RELATED APPLICATIONS

This application is related to co-pending application, Ser. No. 08/280,972, filed Jul. 27, 1995, commonly assigned with the present invention.

BACKGROUND OF THE INVENTION

1. Field of the Invention

The present invention relates to a semiconductor circuit in which a semiconductor circuit unit is protected from a high voltage that can be generated at a signal input terminal for receiving a signal to be inputted to the semiconductor circuit unit.

2. Description of Related Art

As the voltage-current characteristic of a diode, when a voltage applied to the diode exceeds a predetermined threshold value, a current flows through the diode but does not flow in the reverse direction. Therefore, in a semiconductor circuit, a diode is disposed at the input part of a semiconductor circuit unit so as to protect the semiconductor circuit unit connected to the signal input terminal from a high voltage that can be generated at the signal input terminal.

Figure 1:
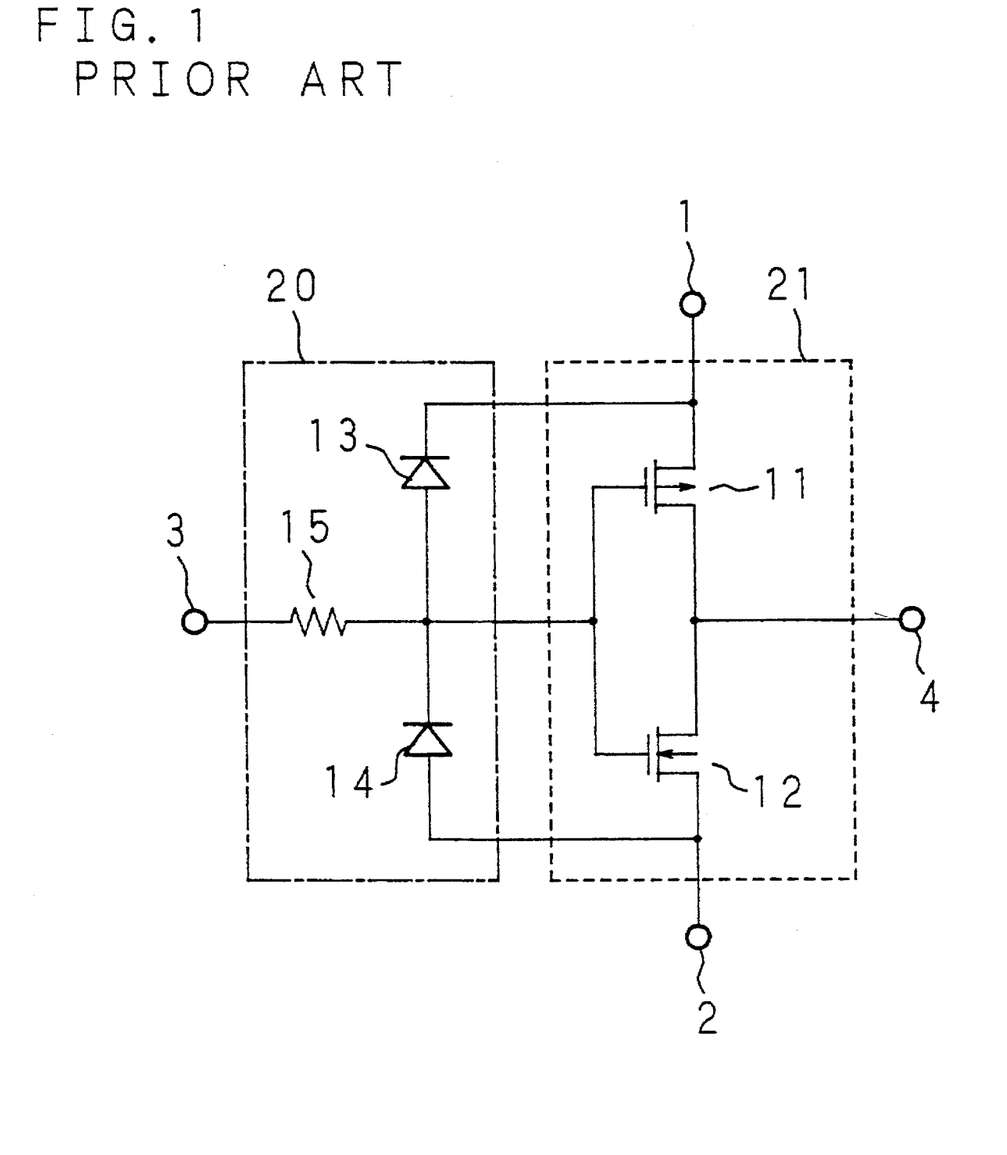
FIG. 1 is a circuit diagram showing the configuration of a conventional semiconductor circuit.

FIG. 1 is a circuit diagram of a conventional semiconductor circuit. A signal input terminal 3 is connected, via a resistor 15, to the anode of a clamping diode 13, the cathode of a clamping diode 14 and the gates of a P-channel transistor 11 and an N-channel transistor 12. One terminal of the series circuit formed with the P-channel transistor 11 and the N-channel transistor 12 is connected to a power supply terminal 1 connected to a first power supply, and the other terminal thereof is connected to a ground power supply terminal 2 connected to a second power supply. The cathode of the clamping diode 13 is connected to a node between the power supply terminal 1 and the P-channel transistor 11, and the anode of the clamping diode 14 is connected to a node between the ground power supply terminal 2 and the N-channel transistor 12.

A node between the P-channel transistor 11 and the N-channel transistor 12 is connected to a signal output terminal 4. Thus, the resistor 15 and the clamping diodes 13 and 14 form an overvoltage protection circuit 20. The P-channel transistor 11 and the N-channel transistor 12 form a semiconductor circuit unit 21 serving as an interface.

The operation of such a semiconductor circuit will now be described. When a signal at a high level is inputted through the signal input terminal 3, the N-channel transistor 12 is turned on and the P-channel transistor 11 is turned off, thereby allowing the signal output terminal 4 to have the same voltage level as that of the ground power supply terminal 2. When a signal at a low level is inputted through the signal input terminal 3, the P-channel transistor 11 is turned on and the N-channel transistor 12 is turned off, thereby allowing the signal output terminal 4 to have the same voltage level as that of the power supply terminal 1. Then, the voltage at the signal output terminal 4 is supplied to another semiconductor circuit unit that is not shown.

In this semiconductor circuit, when a positive high voltage is generated at the signal input terminal 3, a current flows through the clamping diode 13 due to the high voltage, and the input voltage to the semiconductor circuit, unit 21 is clamped. Thus, the semiconductor circuit unit 21 is protected from the positive high voltage. Alternatively, when a negative high voltage is generated at the signal input terminal 3, a current flows through the clamping diode 14 due to the high voltage, and the input voltage to the semiconductor circuit unit 21 is clamped. Thus, the semiconductor circuit unit 21 is protected from the negative high voltage.

Such a conventional semiconductor circuit, however, has the following problem: when, for example, a positive high voltage generated at the signal input terminal 3 exceeds a voltage obtained by adding the supply voltage to the forward voltage of the clamping diode 13, the input current to the clamping diode 13 rapidly increases. As a result, an overcurrent flows from the signal input terminal 3 toward the power supply terminal 1. The overcurrent flows also toward the node between the P-channel transistor 11 and the power supply terminal 1, resulting in flowing into the semiconductor circuit unit 21.

The overcurrent flows through the semiconductor circuit unit 21 in this manner. When the overcurrent is excessive, the current is transmitted through a parasitic diode or a parasitic transistor in the semiconductor circuit unit 21, thereby allowing a large current to flow from the power supply terminal 1 through the P-channel transistor 11 and the N-channel transistor 12. As a result, what is called latch-up can be possibly caused in which the P-channel transistor 11 and the N-channel transistor 12 work abnormally or are damaged.

SUMMARY OF THE INVENTION

The present invention was devised to overcome the aforementioned problem. The objective of the invention is providing a semiconductor circuit in which latch-up is prevented from occurring in a semiconductor circuit unit even when a high voltage is caused at a signal input terminal.

The semiconductor circuit of the invention comprises a signal input terminal, a first power supply terminal connected to a first-power supply, a second power supply terminal connected to a second power supply, a semiconductor circuit unit that is connected between the first power supply terminal and the second power supply terminal and receives a signal inputted through the signal input terminal, a third power supply terminal formed independently from the first power supply terminal and connected to the first power supply, a fourth power supply terminal formed independently from the second power supply terminal and connected to the second power supply, and an overvoltage protection circuit that includes clamping diodes connected in series to each other and is connected between the third power supply terminal and the fourth power supply terminal so that the series node between the clamping diodes be connected to the input part of the semiconductor circuit unit.

Accordingly, when a high voltage is caused at the signal input terminal, an overcurrent caused by the high voltage flows through the overvoltage protection circuit toward the third or fourth power supply terminal connected to the overvoltage protection circuit. Thus, the over-current is prevented from flowing into the semiconductor circuit unit, thereby preventing causing latch-up in the semiconductor circuit unit by the overcurrent.

In the semiconductor circuit of the invention, it is characterized in that the overvoltage protection circuit is plural in number, and the third power supply terminal and the fourth power supply terminal are used in common for these overvoltage protection circuits.

Therefore, the layout pattern can be simplified and tile semiconductor circuit can be minimized.

In the semiconductor circuit of the invention, it is characterized in that the third or fourth power supply terminal is formed in a second wiring layer, and the signal input terminal is formed in a first wiring layer.

Therefore, the power supply terminal is formed in a different wiring layer from the signal input terminal, thereby reducing the impedance of wirings extending from the respective terminals.

Alternatively, the semiconductor circuit of the invention comprises a signal input terminal, a first power supply terminal connected to a first power supply, a second power supply terminal connected to a second power supply, a semiconductor circuit unit that is connected between the first power supply terminal and the second power supply terminal and receives a signal inputted through the signal input terminal, and an overvoltage protection circuit that includes clamping diodes connected in series to each other and is connected between the first power supply terminal and the second power supply terminal so that the series node between the clamping diodes be connected to the input part of the semiconductor circuit unit. The semiconductor circuit unit and the overvoltage protection circuit are directly connected to the first and second power supply terminals.

Accordingly, when the impedance of the power supply and the ground power supply connected to the overvoltage protection circuit is lower than the impedance of the semiconductor circuit unit, an overcurrent caused by a high voltage flows into the first and second power supply terminals. The semiconductor circuit unit is thus protected from being affected by the overcurrent.

In the semiconductor circuit of the invention, it is characterized in that the first or second power supply terminal is formed in a first wiring layer, and the signal input terminal is formed in a second wiring layer.

Therefore, the power supply terminal is formed in a different wiring layer from the signal input terminal, thereby reducing the impedance of wirings extending from the respective terminals.

The above and further objects and features of the invention will more fully be apparent from the following detailed description with accompanying drawings.

DESCRIPTION OF THE PREFERRED EMBODIMENTS

Figure 2:
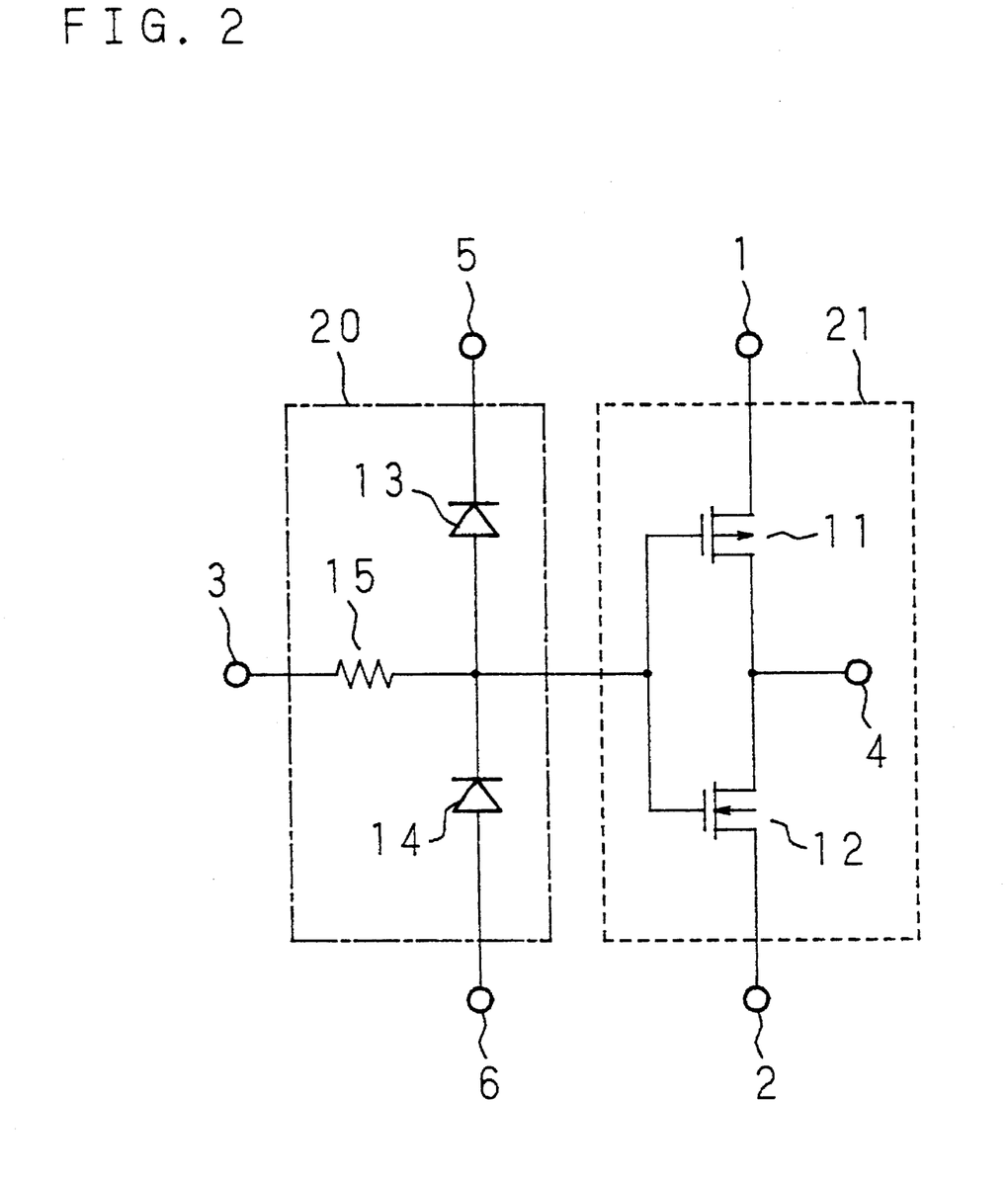
FIG. 2 is a circuit diagram showing the configuration of a semiconductor circuit according to an embodiment of the invention.

The present invention will now be described in detail referring to the accompanying drawings illustrating the embodiments thereof. FIG. 2 is a circuit diagram showing the configuration of a semiconductor circuit of the invention.

A signal input terminal 3 is connected, via a resistor 15, to the anode of a clamping diode 13, the cathode of a clamping diode 14 and the gates of a P-channel transistor 11 and an N-channel transistor 12. One terminal of a series circuit formed with the P-channel transistor 11 and the N-channel transistor 12 is connected to a first power supply terminal connected to a first power supply, i.e., a power supply terminal 1, and the other terminal thereof is connected to a second power supply terminal connected to a second power supply, i.e., a ground power supply terminal 2. The cathode of the clamping diode 13 is connected to a third power supply terminal connected to a first power supply, i.e., a power supply terminal 5, and the anode of the clamping diode 14 is connected to a fourth power supply terminal connected to a second power supply, i.e., a ground power supply terminal 6. A node between the P-channel transistor 11 and the N-channel transistor 12 is connected to a signal output terminal 4.

Thus, the resistor 15 and the clamping diodes 13 and 14 form an overvoltage protection circuit 20, and the P-channel transistor 11 and the N-channel transistor 12 form a semiconductor circuit unit 21 serving as an interface. The clamping diodes 13 and 14 are formed on a different semiconductor substrate from that bearing the semiconductor circuit unit 21, and these substrates are electrically separated from each other.

The operation of this semiconductor circuit will be described. When a signal at a high level is inputted through the signal input terminal 3, the N-channel transistor 12 is turned on and the P-channel transistor 11 is turned off, thereby allowing the signal output terminal 4 to have the same voltage level as that of the ground power supply terminal 2. Alternatively, when a signal at a low level is inputted through the signal input terminal 3, the P-channel transistor 11 is turned on and the N-channel transistor 12 is turned off, thereby allowing the signal output terminal 4 to have the same voltage level as that of the power supply terminal 1. Thus, the voltage at the signal output terminal 4 is supplied to another semiconductor circuit unit that is not shown.

For example, when a positive high voltage is generated at the signal input terminal 3, an overcurrent caused by the high voltage flows through the clamping diode 13 to the power supply terminal 5. When a negative high voltage is generated at the signal input terminal 3, an overcurrent caused by the high voltage flows through the clamping diode 14 from the ground power supply terminal 6 to the node between the clamping diodes 13 and 14. As a result, the input voltage to the semiconductor circuit unit 21 is clamped, thereby protecting the semiconductor circuit unit 21 from the high voltage. Further, the overcurrent flowing through the clamping diode 13 or 14 does not flow through the semiconductor circuit unit 21, resulting in preventing the occurrence of latch-up in the semiconductor circuit unit 21.

Figure 3:
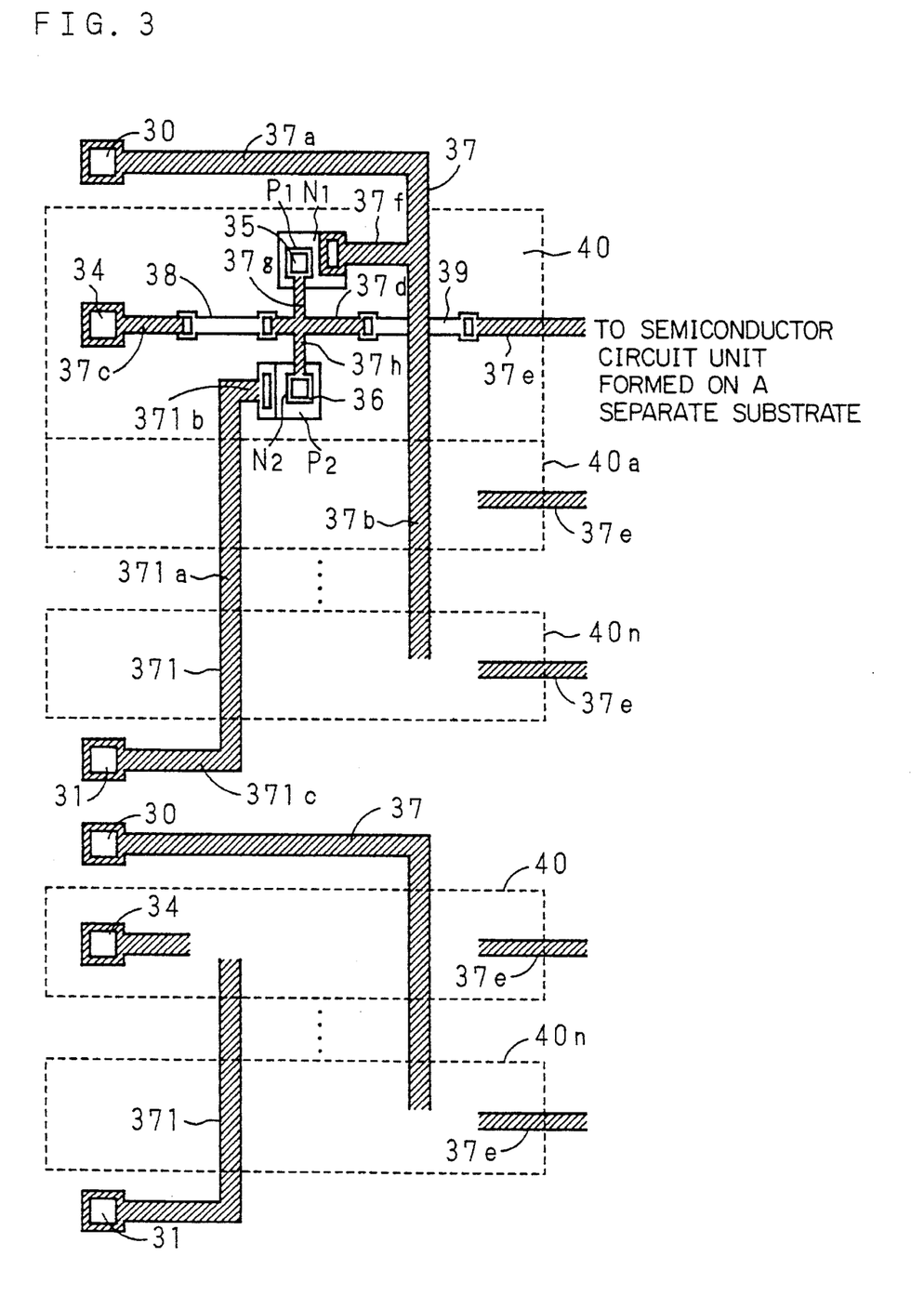
FIG. 3 shows a layout pattern for an overvoltage protection circuit according to the invention.

FIG. 3 shows a layout pattern for a semiconductor circuit having a plurality of such overvoltage protection circuits. A power supply pad 30 is connected to an aluminum wiring 37 formed in tile shape of an L. The aluminum wiring 37 has an appropriate width, and includes a short wiring portion 37a and a long wiring portion 37b. A signal input pad 34 is formed at an appropriate distance away from the power supply pad 30 in the direction vertical to the short wiring portion 37a of tile aluminum wiring 37? . The signal input pad 34 is connected to an end of an aluminum wiring 37c formed parallel to tile short wiring portion 37a. The other end of the aluminum wiring portion 37c is connected, via a diffused resistor portion 38 made of polysilicon, to an end of an aluminum wiring 37d formed in the shape of a cross. The other end that is on the side far away from the signal input pad 34, of the aluminum wiring portion 37d is connected, via a diffused resistor portion 39 made of polysilicon, to an end of an aluminum wiring 37e. The diffused resistor portion 39 is disposed below and orthogonally against the long wiring portion 37b. The other end of the aluminum wiring portion 37e is connected to a semiconductor circuit unit that is not shown.

An aluminum wiring portion 37f is formed parallel to the short wiring portion 37a so as to extend from the long wiring portion 37b of the aluminum wiring 37 at a middle position between the bending point of the aluminum wiring 37 and the crossing point of the diffused resistor portion 39 made of polysilicon and the long wiring portion 37b. The aluminum wiring portion 37f is connected to a rectangular N-type diffusion region $N_1$. In the N-type diffusion region $N_1$ is formed a P-type diffusion region $P_1$. The P-type diffusion region $P_1$ is connected to an aluminum wiring portion 37g, which extends parallel to tile long wiring portion 37b from the aluminum wiring portion 37d toward the short wiring portion 37a.

The N-type diffusion region $N_1$ and the P-type diffusion region $P_1$ form a clamping diode 35, those cathode is connected to the power supply pad 30. At a position symmetrical to the clamping diode 35 about the aluminum wiring portion 37d is formed a rectangular P-type diffusion region $P_2$. In the P-type diffusion region $P_2$ is formed an N-type diffusion region $N_2$, which is connected to an aluminum wiring portion 37h. The aluminum wiring portion 37h extends parallel to the long wiring portion 37b from the aluminum wiring portion 37d toward the N-type diffusion region $N_2$.

The P-type diffusion region $P_2$ is connected to a ground power supply pad 31 with an aluminum wiring 371, which is formed in the shape of a clamp so as to have a short wiring portion 371a, a long wiring portion 371b and another short wiring portion 371c. The P-type diffusion region $P_2$ and the N-type diffusion region $N_2$ form a clamping diode 36, whose anode is connected to the ground power supply pad 31. The clamping diode 36 is disposed between the ground power supply pad 31 arid the node between the clamping diodes 35 and 36.

The clamping diode 35 connected to the power supply pad 30 and the clamping diode 36 connected to the ground power supply pad 31 form an overvoltage protection circuit 40. The overvoltage protection circuit 40 functions in the same manner as the overvoltage protection circuit 20 shown in FIG. 2. In the layout of FIG. 3, white wirings are formed in a first wiring layer, and hatched wirings are formed in a second wiring layer that is formed on the first wiring layer.

In addition to the overvoltage protection circuit 40, a plurality of overvoltage protection circuits 40a through 40n each having the same configuration as the overvoltage protection circuit 40 are disposed between the power supply pad 30 and the ground power supply pad 31. The aluminum wirings 37 and 371 are connected to the respective overvoltage protection circuits 40 and 40a through 40n in common in the same manner as the overvoltage protection circuit 40. Each of the overvoltage protection circuits 40 and 40a through 40n is connected to one of a plurality of semiconductor circuit units that are not shown. A power supply pad and a ground power supply pad connected to these semiconductor circuit units that are not shown are formed independently from the power supply pad 30 and the ground power supply pad 31.

Further, a plurality of circuit blocks each having the aforementioned configuration including the power supply pad 30, the ground power supply pad 31, the signal input pad 34 and a plurality of overvoltage protection circuits 40 and 40a through 40n are formed in the direction in which the long wiring portions 37b and 371a extend. Thus, tile plural overvoltage protection circuits 40 and 40a through 40n are commonly connected to the aluminum wiring 37 connected to the power supply pad 30 and the aluminum wiring 371 connected to the ground power supply pad 31. As a result, the numbers of the power supply pad 30 and the ground power supply pad 31 to be formed in one semiconductor circuit can be decreased, thereby simplifying the layout pattern for the semiconductor circuit. This simplification leads to the minimization of the semiconductor circuit.

Figure 4:
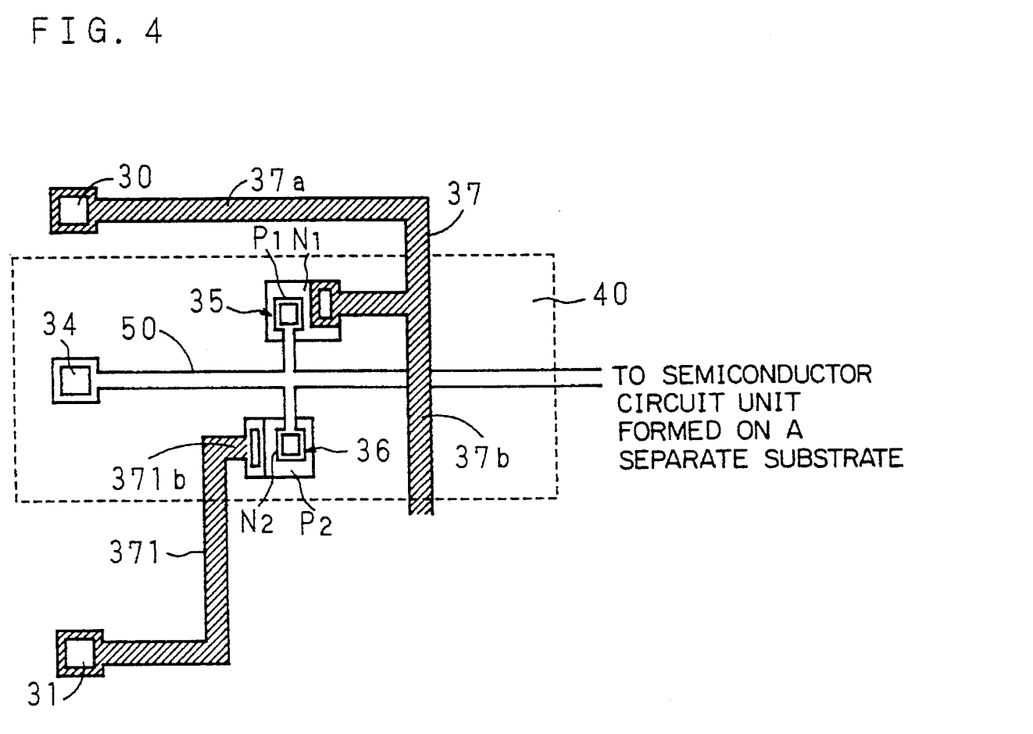
FIG. 4 shows another layout pattern for the overvoltage protection circuit according to the invention.

FIG. 4 shows another layout pattern for the overvoltage protection circuit. A signal input pad 34 formed in a first wiring layer is connected to an aluminum wiring 50 formed in the shape of a cross. Aluminum wirings 37 and 371 connected to a power supply pad 30 and a ground power supply pad 31, respectively are formed in a second wiring layer. The aluminum wiring 50 is formed below the aluminum wirings 37 and 371. A short aluminum wiring portion extending from the aluminum wiring 50 toward a clamping diode 35 is connected to a P-type diffusion region Pi which forms the clamping diode 35.

Another short aluminum wiring portion extending from the aluminum wiring 50 toward a clamping diode 36 is connected to an N-type diffusion region $N_2$, which forms the clamping diode 36. The aluminum wiring 50 is connected to the input part of a semiconductor circuit unit that is not shown. The rest of the configuration is the same as that of the overvoltage protection circuit 40 shown in FIG. 3, and therefore, the same reference numerals are used to refer to the same elements and the description thereof is omitted.

In this embodiment, the aluminum wiring 37, i.e., a power supply wiring connected to the power supply pad 30, and the aluminum wiring 371, i.e., a ground power supply wiring connected to the ground power supply pad 31, are formed in a different wiring layer from the aluminum wiring 50, i.e., a signal wiring connected to the signal input pad 34. Therefore, the impedance of the power supply wirings and the signal wiring can be decreased, and the pattern can be more freely laid out.

Figure 5:
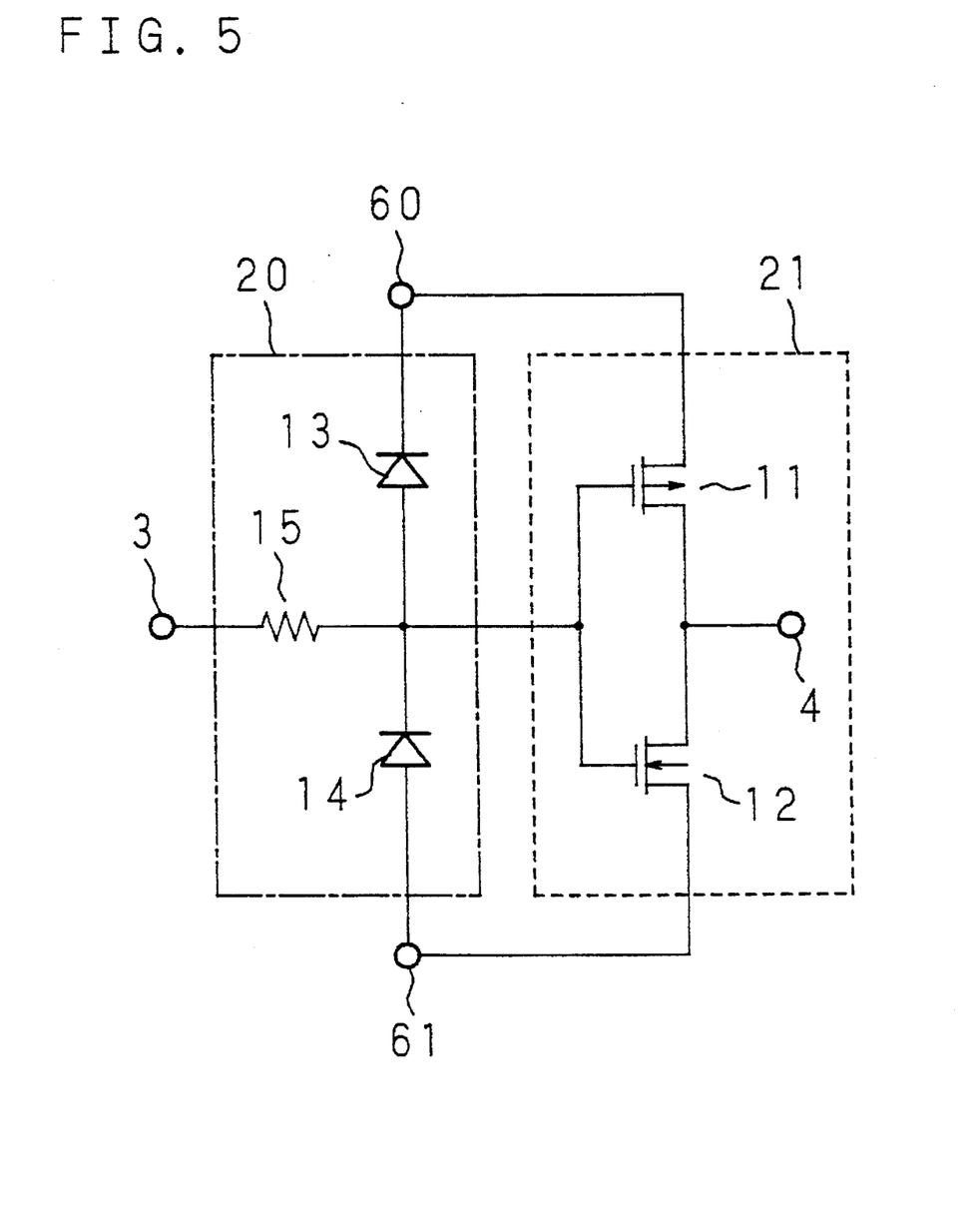
FIG. 5 is a circuit diagram showing the configuration of a semiconductor circuit according to another embodiment of the invention.

FIG. 5 is a circuit diagram showing the configuration of a semiconductor circuit according to another embodiment of the invention. A clamping diode 13 in an overvoltage protection circuit 20 and a P-channel transistor 11 in a semiconductor circuit unit 21 are connected to a power supply terminal 60 in common. A clamping diode 14 in the overvoltage protection circuit 20 and an N-channel transistor 12 in the semiconductor circuit unit 21 are connected to a ground power supply terminal 61 in common. Therefore, a wiring to be connected to the clamping diode 13 and a wiring to be connected to the P-channel transistor 11 are branched from the power supply terminal 60 commonly used for the overvoltage protection circuit 20 and the semiconductor circuit unit 21. Similarly, a wiring to be connected to the clamping diode 14 and a wiring to be connected to the N-channel transistor 12 are branched from the ground power supply terminal 61 commonly used for the overvoltage protection circuit 20 and the semiconductor circuit unit 21. The rest of the configuration of this semiconductor circuit is the same as that shown in FIG. 2, and therefore, the same reference numerals are used to refer to the same elements and the description thereof is omitted.

in the semiconductor circuit that has such a configuration, the P-channel transistor 11 and the N-channel transistor 12 are turned on/off in accordance with a signal inputted through the signal input terminal 3, thereby varying the voltage level at the signal output terminal 4 as described with respect to the aforementioned embodiment. When a high voltage is generated at the signal input terminal 3, an overcurrent caused by the high voltage flows through the clamping diode 13 or 14, thereby clamping the input voltage to the semiconductor circuit unit 21. Thus, the semiconductor circuit unit 21 is protected from the high voltage.

Moreover, the voltage protection circuit 20 and the semiconductor circuit unit 21 can connect respective one thereof to the power supply in common, and respective the other to separate power supply.

Further, even when an overcurrent caused by a high voltage flows through the clamping diodes 13, 14, the over-current is prevented from flowing into the semiconductor circuit unit 21 if the impedance of the power supply and the ground power supply connected to the power supply terminal 60 and the ground power supply terminal 61 is lower than the impedance of the semiconductor circuit unit 21. Therefore, latch-up can be prevented from occurring in this semiconductor circuit unit 21. Moreover, since the power supply terminal 60 and the ground power supply terminal 61 are used in common for the overvoltage protection circuit 20 and the semiconductor circuit unit. 21 in this embodiment, the numbers of the power supply terminal 60 and the ground power supply terminal 61 to be formed in one semiconductor circuit can be reduced, resulting in the minimization of the semiconductor circuit.

Figure 6:
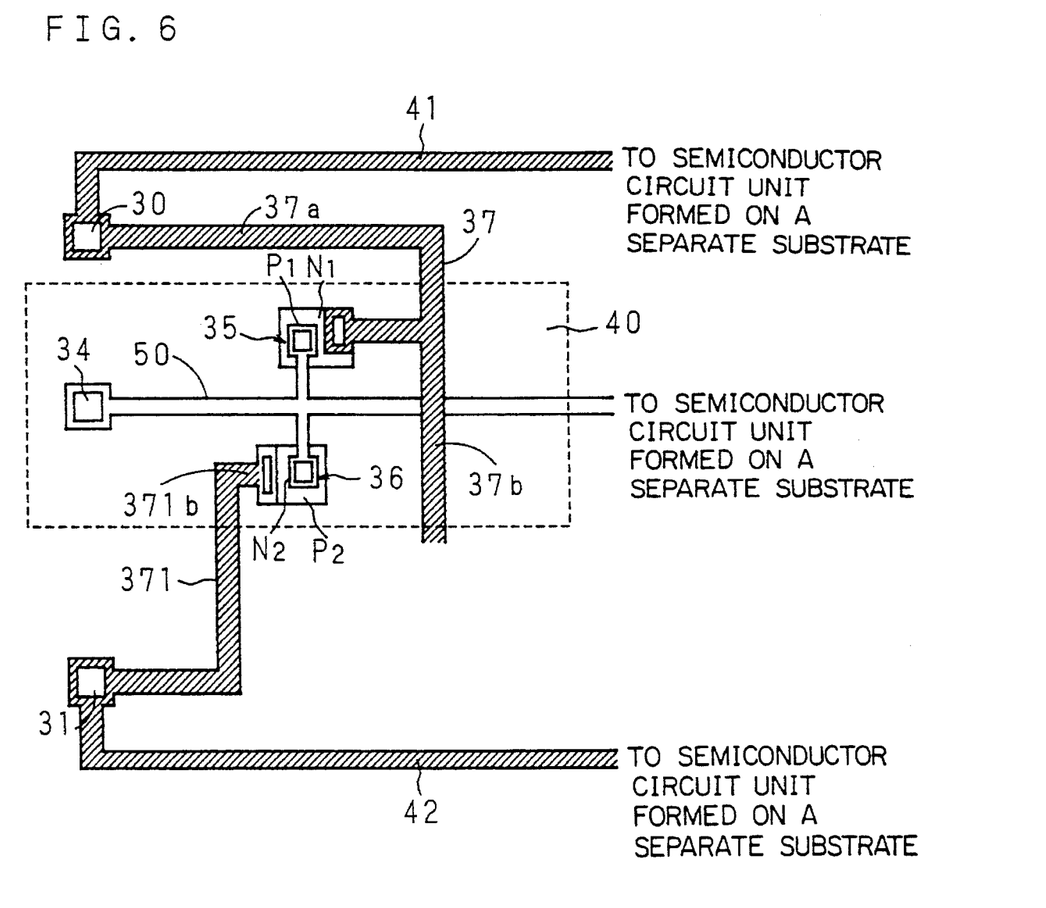
FIG. 6 shows still another layout pattern for the overvoltage protection circuit according to the invention.

FIG. 6 is a plan diagram showing a layout pattern for the overvoltage protection circuit which has such a configuration as shown in FIG. 5. An aluminum wiring 37, that is, a power supply wiring connected to a power supply pad 60, and an aluminum wiring 371, that is, a ground power supply wiring connected to a ground power supply pad 61, are formed in a different wiring layer from an aluminum wiring 50, that is, a signal wiring connected to a signal input pad 34. From the power supply pad 60 are branched and formed the aluminum wiring 37 connected to an overvoltage protection circuit 40 and an aluminum wiring 41 connected to a semiconductor circuit unit that is not shown. From the ground power supply pad 61 are branched and formed the aluminum wiring 371 connected to the overvoltage protection circuit 40 and an aluminum wiring 42 connected to the semiconductor circuit unit. The rest of the configuration is the same as that shown in FIG. 4, and therefore, the same reference numerals are used to refer to the same elements and the description thereof is omitted.

In such a semiconductor circuit, since the aluminum wirings are formed in different wiring layers as above, the impedance of the power supply wiring and the signal wiring can be reduced.

In this manner, the first power supply terminal connected to the first power supply for a semiconductor circuit unit is formed independently from the third power supply terminal connected to the first power supply for an overvoltage protection circuit in this invention. And the second power supply terminal connected to the second power supply for a semiconductor circuit unit is formed independently from the fourth power supply terminal connected to the second power supply for an overvoltage protection circuit in this invention. Therefore, an overcurrent flowing through the overvoltage protection circuit is prevented from flowing into the semiconductor circuit unit, thereby preventing the occurrence of latch-up in the semiconductor circuit unit. Further, wirings connected to the third and fourth power supply terminals are commonly connected to a plurality of overvoltage protection circuits. Therefore, the numbers of the second and fourth power supply terminals to be formed in one semiconductor circuit can be reduced. Moreover, aluminum wirings between these elements are formed in different wiring layers, thereby reducing the impedance in the wirings and increasing the degree of freedom in designing the layout pattern.

Furthermore, a wiring to be connected to the over-voltage protection circuit and the semiconductor circuit unit is branched from the first power supply terminal connected to the first power supply, and/or a wiring to be connected to the overvoltage protection circuit and the semiconductor circuit unit is branched from the second power supply terminal connected to the second power supply. Therefore, even if a high voltage is caused at a signal input terminal, an overcurrent caused by the high voltage flows into the power supply with a low impedance connected to the power supply terminal. In this manner, the overcurrent is prevented from flowing into the semiconductor circuit unit and latch-up is prevented from occurring in the semiconductor circuit unit. Further, since the power supply terminal is thus commonly used, the number of power supply terminals to be formed in one semiconductor circuit, can be decreased, thereby minimizing the semiconductor circuit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor circuit in which clamping diodes are disposed at an input part of a semiconductor circuit unit to protect the semiconductor circuit unit connected to a signal input terminal from a high voltage that can be generated at the signal input terminal, comprising:

a signal input terminal;

a first power supply terminal connected to a first power supply potential;

a second power supply terminal connected to a second power supply potential;

a semiconductor circuit unit formed on a substrate connected between said first power supply terminal and said second power supply terminal, said semiconductor circuit unit receiving, at the input part thereof, a signal inputted from said signal input terminal;

a third power supply terminal formed independently from said first power supply terminal and connected to said first power supply potential;

a fourth power supply terminal formed independently from said second power supply terminal and connected to said first power supply potential; and an overvoltage protection circuit formed on a different semiconductor substrate from that bearing said semiconductor circuit unit, said substrates being electrically separated from each other, said protection circuit being connected between said third power supply terminal and said fourth power supply terminal and including clamping diodes connected in series with each other, a series node between said clamping diodes being connected to the input part of said semiconductor unit, whereby an overcurrent is prevented from flowing into the semiconductor circuit unit, thereby preventing latch up in the semiconductor circuit unit by the overcurrent, and wherein said signal input terminal is formed in a first wiring layer of said different semiconductor substrate, and at least one of said third power supply terminal and said fourth power supply terminal is formed in a second wiring layer other than said first wiring layer of said different semiconductor substrate.

2. A semiconductor circuit in which clamping diodes are disposed at an input part of a semiconductor circuit unit to protect the semiconductor circuit unit connected to a signal input terminal from a high voltage that can be generated at the signal input terminal, comprising:

a signal input terminal;

a first power supply terminal connected to a first power supply potential;

a second power supply terminal connected to a second power supply potential;

a semiconductor circuit unit formed on a substrate and connected between said first power supply terminal and said second power supply terminal, said semiconductor circuit unit receiving, at the input part thereof, a signal inputted from said signal input terminal; and an overvoltage protection circuit formed on a different semiconductor substrate from that bearing said semiconductor circuit unit, said substrates being electrically separated from each other, said protection circuit being connected between said first power supply terminal and said second power supply terminal and said second power supply terminal and including clamping diodes connected in series with each other, a series node between said clamping diodes being connected to the input part of said semiconductor unit, wherein wirings connecting said semiconductor circuit unit and said overvoltage protection circuit to said first power supply terminal are branched from said first power supply terminal, whereby an overcurrent is prevented from flowing into the semiconductor circuit unit, thereby preventing latch up in the semiconductor circuit unit by the overcurrent, and wherein said signal input terminal is formed in a first wiring layer of said different semiconductor substrate, and at least one of said first power supply terminal and said second power supply terminal is formed in a second wiring layer other than said first wiring layer of said different semiconductor substrate.

3. A semiconductor circuit in which clamping diodes are disposed at an input part of a semiconductor circuit unit to protect the semiconductor circuit unit connected to a signal input terminal from a high voltage that can be generated at the signal input terminal, comprising:

a signal input terminal;

a first power supply terminal connected to a first power supply potential;

a second power supply terminal connected to a second power supply potential;

a semiconductor circuit unit formed on a substrate and connected between said first power supply terminal and said second power supply terminal, said semiconductor circuit unit receiving, at the input part thereof, a signal inputted from said signal input terminal;

an overvoltage protection circuit formed on a different semiconductor substrate from that bearing said semiconductor circuit unit, said substrates being electrically separated from each other, said protection circuit being connected between said first power supply terminal and said second power supply terminal and including clamping diodes connected in series with each other, a series node between said clamping diodes being connected to the input part of said semiconductor unit, wherein wirings connecting said semiconductor circuit unit and said overvoltage protection circuit to said second power supply terminal are branched from said second power supply terminal, whereby an overcurrent is prevented from flowing into the semiconductor circuit unit, thereby preventing latch up in the semiconductor circuit unit by the overcurrent, and wherein said signal input terminal is formed in a first wiring layer of said different semiconductor substrate, and at least one of said first power supply terminal and said second power supply terminal is formed in a second wiring layer other than said first wiring layer of said different semiconductor substrate.

4. A semiconductor circuit in which clamping diodes are disposed at an input part of a semiconductor circuit unit to protect the semiconductor circuit unit connected to a signal input terminal from a high voltage that can be generated at the signal input terminal, comprising:

a signal input terminal;

a first power supply terminal connected to a first power supply potential;

a second power supply terminal connected to a second power supply potential;

a semiconductor circuit unit formed on a substrate connected between said first power supply terminal and said second power supply terminal, said semiconductor circuit unit receiving, at the input part thereof, a signal inputted from said signal input terminal; and an overvoltage protection circuit formed on a different semiconductor substrate from that bearing said semiconductor circuit unit, said substrates being electrically separated from each other, said protection circuit being connected between said first power supply terminal and said second power supply terminal and including clamping diodes connected in series with each other, a series node between said clamping diodes being connected to the input part of said semiconductor unit, wherein wirings connecting said semiconductor circuit unit and said overvoltage protection circuit to said first power supply terminal are branched from said first power supply terminal, and wirings connecting said semiconductor circuit unit and said overvoltage protection circuit to said second power supply terminal are branched from said second power supply terminal, whereby an overcurrent is prevented from flowing into the semiconductor circuit unit, thereby preventing latch up in the semiconductor circuit unit by the overcurrent, and wherein said signal input terminal is formed in a first wiring layer of said different semiconductor substrate, and at least one of said first power supply terminal and said second power supply terminal is formed in a second wiring layer other than said first wiring layer of said different semiconductor substrate.

5. A semiconductor circuit arrangement, comprising:

a plurality of input terminals;

a first power supply terminal connected to a first power supply potential;

a second power supply terminal connected to a second power supply potential;

a plurality of semiconductor circuit units formed on a substrate and connected between said first power supply terminal and said second power supply terminal, each semiconductor circuit unit receiving, at an input part thereof, a signal from one of said input terminals;

a third power supply terminal formed independently from said first power supply terminal and connected to said first power supply potential;

a fourth power supply terminal formed independently from said second power supply terminal and connected to said second power supply potential; and a plurality of overvoltage protection circuits formed on a different semiconductor substrate from that bearing said semiconductor circuit units, said substrates being electrically separated from each other, each overvoltage protection circuit protecting one of the plurality of semiconductor circuit units, said plurality of protection circuits being connected between said third power supply terminal and said fourth power supply terminal, said third power supply terminal and said fourth power supply terminal being used in common for said plurality of overvoltage protection circuits, each of said overvoltage protection circuits including clamping diodes connected in series with each other and between said common third power supply terminal and fourth power supply terminal, each series node between said clamping diodes being coupled to one of said input terminals and to the input part of a corresponding semiconductor circuit unit;

whereby an overcurrent is prevented from flowing into the semiconductor circuit units, thereby preventing latch up in the semiconductor circuit units by the overcurrent.

* * * * *